(12) United States Patent
Kanamaru et al.

(10) Patent No.: US 11,644,852 B2
(45) Date of Patent: May 9, 2023

(54) FLOW RATE RATIO CONTROL SYSTEM, FILM FORMING SYSTEM, ABNORMALITY DIAGNOSIS METHOD, AND ABNORMALITY DIAGNOSIS PROGRAM MEDIUM

(71) Applicant: HORIBA STEC, Co., Ltd., Kyoto (JP)

(72) Inventors: Yusuke Kanamaru, Kyoto (JP); Kotaro Takijiri, Kyoto (JP); Kazuya Shakudo, Kyoto (JP)

(73) Assignee: HORIBA STEC, Co., Ltd., Kyoto (JP)

( * ) Notice: Subject to any disclaimer, the term of this patent is extended or adjusted under 35 U.S.C. 154(b) by 226 days.

(21) Appl. No.: 17/316,940

(22) Filed: May 11, 2021

(65) Prior Publication Data
US 2021/0355583 A1    Nov. 18, 2021

(30) Foreign Application Priority Data
May 12, 2020  (JP) .............................. JP2020-084087

(51) Int. Cl.
| | |
|---|---|
| *G05D 11/13* | (2006.01) |
| *G01F 15/06* | (2022.01) |
| *F16K 37/00* | (2006.01) |
| *G05D 7/06* | (2006.01) |
| *H01L 21/67* | (2006.01) |
| *C23C 16/52* | (2006.01) |
| *C23C 16/455* | (2006.01) |

(52) U.S. Cl.
CPC .......... *G05D 11/132* (2013.01); *F16K 37/005* (2013.01); *G01F 15/06* (2013.01); *G05D 7/0652* (2013.01); *G05D 7/0664* (2013.01); *H01L 21/67253* (2013.01); *C23C 16/45561* (2013.01); *C23C 16/52* (2013.01); *G05D 7/0635* (2013.01)

(58) Field of Classification Search
CPC .............. C23C 16/45561; C23C 16/52; G05D 7/0635; G05D 7/0652; G05D 7/0664; G05D 11/131; G05D 11/132; G01F 15/06; Y10T 137/2529; Y10T 137/2562; H01L 21/67253; F16K 37/005
USPC ............................................ 137/101.19, 110
See application file for complete search history.

(56) References Cited

U.S. PATENT DOCUMENTS

| | | | | |
|---|---|---|---|---|
| 6,333,272 | B1 * | 12/2001 | McMillin | .......... H01L 21/67069 |
| | | | | 438/935 |
| 6,941,965 | B2 * | 9/2005 | Lull | ..................... G05D 7/0664 |
| | | | | 137/12 |

(Continued)

FOREIGN PATENT DOCUMENTS

JP          2007095042 A          4/2007

*Primary Examiner* — William M McCalister
(74) *Attorney, Agent, or Firm* — Alleman Hall Creasman & Tuttle LLP

(57) ABSTRACT

A system that controls the flow rates of a plurality of split channels provided parallel to each other to a certain flow split ratio includes: a flow split ratio calculation unit that, in order to be able to diagnose whether a system abnormality that affects the flow split ratio is occurring, calculates a ratio of output values of flow rate sensors obtained by allowing, while fluid control valves of different split channels are closed, fluids to flow in these split channels as an actual flow split ratio; a reference flow split ratio storage unit that stores a reference flow split ratio serving as a reference for the actual flow split ratio; and an abnormality diagnosis unit that compares the actual flow split ratio and the reference flow split ratio, and diagnoses a system abnormality.

10 Claims, 7 Drawing Sheets

(56) References Cited

U.S. PATENT DOCUMENTS

| | | | | |
|---|---|---|---|---|
| 2004/0112435 A1* | 6/2004 | Olander | ............... | G05D 7/0652 |
| | | | | 137/487.5 |
| 2007/0186983 A1* | 8/2007 | Ding | .................... | G05D 11/132 |
| | | | | 137/487.5 |
| 2007/0240778 A1* | 10/2007 | L'Bassi | ................ | G05D 7/0664 |
| | | | | 137/883 |
| 2009/0178714 A1* | 7/2009 | Sawusch | ................... | F17D 5/00 |
| | | | | 137/12 |
| 2013/0085618 A1* | 4/2013 | Ding | .................... | G05D 7/0664 |
| | | | | 700/282 |
| 2014/0034164 A1* | 2/2014 | Yasuda | ................ | G05D 7/0617 |
| | | | | 137/599.01 |
| 2018/0313561 A1* | 11/2018 | Sinha | ........................ | F24F 11/32 |
| 2019/0073238 A1* | 3/2019 | Ludwig | ............... | G06F 9/30072 |

\* cited by examiner

FLOW RATE RATIO CONTROL SYSTEM, FILM FORMING SYSTEM, ABNORMALITY DIAGNOSIS METHOD, AND ABNORMALITY DIAGNOSIS PROGRAM MEDIUM

BACKGROUND OF THE INVENTION

Field of the Invention

The present invention relates to a flow rate ratio control system and a film forming system used in a semiconductor manufacturing process or the like, and an abnormality diagnosis method and an abnormality diagnosis program medium for the flow rate ratio control system.

Description of the Related Art

An exemplary flow rate ratio control system of this type includes a plurality of split channels provided parallel to each other, and is configured to control the ratio of flow rates of fluids flowing in the split channels to a certain flow split ratio.

More specifically, in the above-mentioned flow rate ratio control system, each of the split channels is provided with a flow rate sensor and a fluid control valve, and the fluid control valves are controlled so that the ratio of output values of the individual flow rate sensors becomes a certain flow split ratio.

For such a flow rate ratio control system, Japanese Unexamined Patent Application Publication No. 2007-095042 describes a method of allowing a fluid to flow while closing a shutoff valve provided in each split channel, and examining whether there is a leakage by measuring a pressure rise at that time.

However, even if it is diagnosed that there is no leakage by such an examination, if there is an abnormality such as clogging in a flow rate sensor, the flow rates flowing in the split channels will not be of the certain flow split ratio, and, if there is an abnormality different from a leakage in a fluid control valve, the certain flow split ratio will not be achieved either.

SUMMARY OF THE INVENTION

To solve the above-mentioned problems, it is an object of the present invention to be able to, in a system that controls the flow rates of a plurality of split channels provided parallel to each other to a certain flow split ratio, diagnose whether a system abnormality that affects the flow split ratio is occurring.

That is, a flow rate ratio control system according to the present invention is a flow rate ratio control system including a plurality of split channels provided parallel to each other, a flow rate sensor provided in each of the split channels, and a fluid control valve provided downstream of the flow rate sensor in each of the split channels, the fluid control valves being controlled so that a ratio of flow rates of fluids flowing in the respective split channels becomes a certain flow split ratio, the system including: a flow split ratio calculation unit that calculates a ratio of output values of the flow rate sensors obtained by allowing, while the fluid control valves of different split channels are closed, fluids to flow in these split channels as an actual flow split ratio; a reference flow split ratio storage unit that stores a reference flow split ratio serving as a reference for the actual flow split ratio; and an abnormality diagnosis unit that compares the actual flow split ratio and the reference flow split ratio, and diagnoses a system abnormality.

According to the flow rate ratio control system configured as above, because the actual flow split ratio and the reference flow split ratio are compared, it is possible to diagnose whether a system abnormality that affects the actual flow split ratio is occurring, such as various abnormalities including a leakage in a fluid control valve, and various abnormalities including clogging in a flow rate sensor.

It is preferable that the actual flow split ratio calculated by the flow split ratio calculation unit be obtained by allowing fluids to flow in internal volumes extending from the flow rate sensors to the fluid control valves in the split channels.

With such a configuration, the flow split ratio obtained by allowing fluids to flow in the internal volumes becomes a constant ratio with good reproducibility if there is no system abnormality, and accordingly, the plausibility of the diagnosis may be enhanced.

A specific embodiment of the reference flow split ratio is a ratio of output values of the flow rate sensors obtained by allowing, while the fluid control valves of different split channels are closed at an early stage of manufacturing the system or after maintenance of the system, fluids to flow in these split channels.

In order to be able to diagnose an abnormality of a flow rate sensor, which is one of system abnormalities, it is preferable that the abnormality diagnosis unit be configured to diagnose that, in a case where the actual flow split ratio includes a numeral smaller than the reference flow split ratio, there is an abnormality in the flow rate sensor of a split channel corresponding to the numeral.

In order to be able to diagnose an abnormality of a fluid control valve, which is one of system abnormalities, it is preferable that the abnormality diagnosis unit be configured to diagnose that, in a case where the actual flow split ratio includes a numeral larger than the reference flow split ratio, there is an abnormality in the fluid control valve of a split channel corresponding to the numeral.

If the flow rate sensors are thermal flow rate sensors, clogging of a laminar flow element such as a bypass channel may be diagnosed.

A specific embodiment of the fluid control valves is a valve with a position sensor that detects a position of a valve body with respect to a valve seat.

In addition, an abnormality diagnosis method according to the present invention is an abnormality diagnosis method for a flow rate ratio control system including a plurality of split channels provided parallel to each other, a flow rate sensor provided in each of the split channels, and a fluid control valve provided downstream of the flow rate sensor in each of the split channels, the fluid control valves being controlled so that a ratio of flow rates of fluids flowing in the respective split channels becomes a certain flow split ratio, the method including: calculating a ratio of output values of the flow rate sensors obtained by allowing, while the fluid control valves of different split channels are closed, fluids to flow in these split channels as an actual flow split ratio; and comparing the actual flow split ratio and a reference flow split ratio serving as a reference for the actual flow split ratio, and diagnosing a system abnormality.

Furthermore, an abnormality diagnosis program medium used in a flow rate ratio control system including a plurality of split channels provided parallel to each other, a flow rate sensor provided in each of the split channels, and a fluid control valve provided downstream of the flow rate sensor in each of the split channels, the fluid control valves being controlled so that a ratio of flow rates of fluids flowing in the respective split channels becomes a certain flow split ratio, the medium storing a program causing a computer to function as: a flow split ratio calculation unit that calculates a ratio of output values of the flow rate sensors obtained by allowing, while the fluid control valves of different split channels are closed, fluids to flow in these split channels as an actual flow split ratio; a reference flow split ratio storage unit that stores a reference flow split ratio serving as a reference for the actual flow split ratio; and an abnormality diagnosis unit that compares the actual flow split ratio and the reference flow split ratio, and diagnoses a system abnormality.

With the abnormality diagnosis method or the abnormality diagnosis program medium, operational effects that are the same as or similar to those achieved by the above-mentioned flow rate ratio control system may be achieved.

According to the present invention configured as above, in a system that controls the flow rates of a plurality of split channels provided parallel to each other to a certain flow split ratio, whether a system abnormality that affects the flow split ratio is occurring may be diagnosed.

DESCRIPTION OF THE PREFERRED EMBODIMENTS

Hereinafter, an embodiment of a flow rate ratio control system according to the present invention will be described with reference to the drawings.

Figure 1:
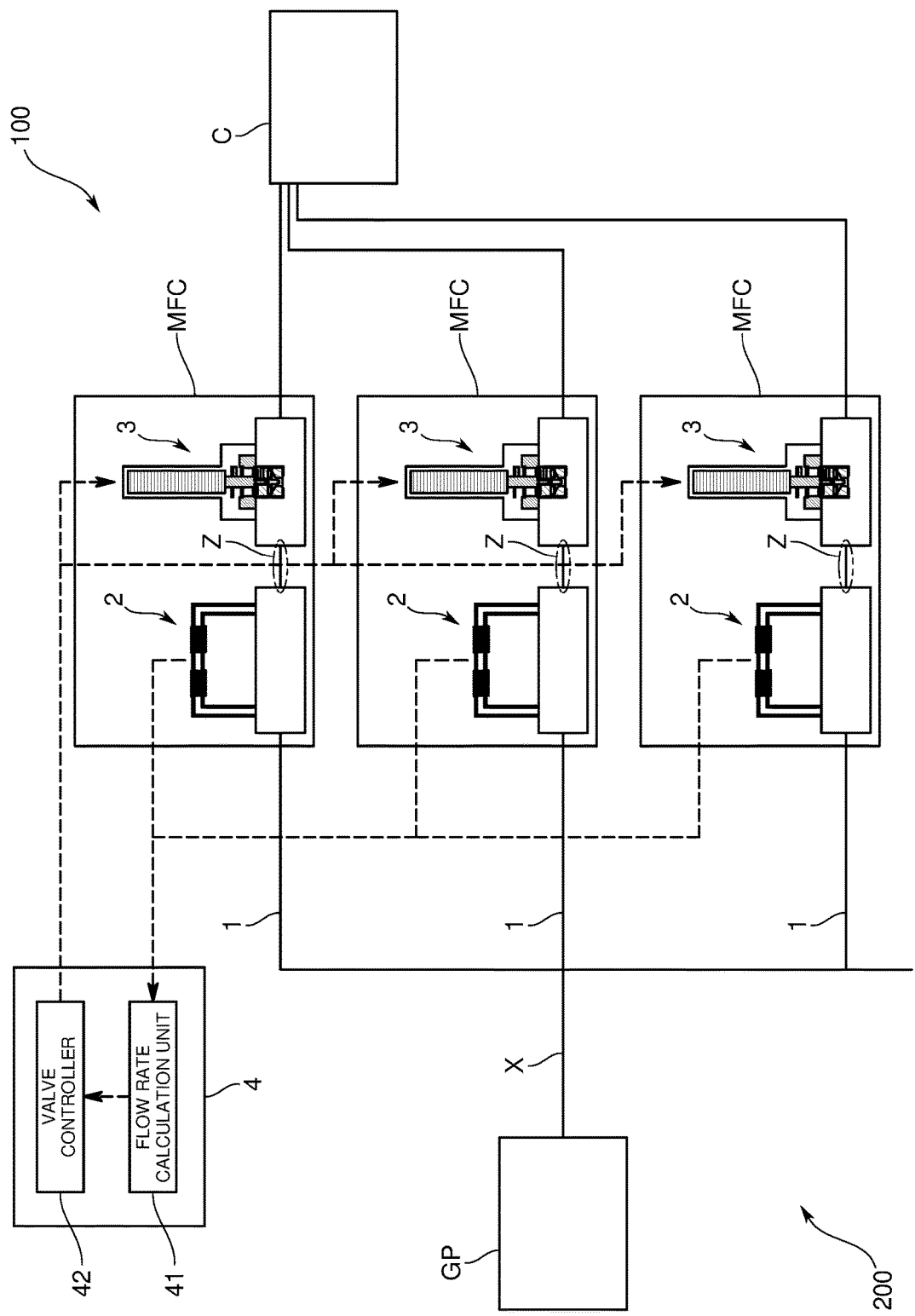
FIG. 1 is a schematic diagram illustrating the configuration of a flow rate ratio control system according to an embodiment of the present invention.

A flow rate ratio control system 100 of the present embodiment is used in semiconductor processing or the like, and, as illustrated in FIG. 1, is used for supplying fluids with a desired flow rate ratio to a plurality of supply ports provided in a film forming chamber C provided downstream.

Note that a gas panel GP is provided upstream of the flow rate ratio control system 100. The gas panel GP has, for example, a plurality of mass flow controllers, and supplies a fluid with a certain flow rate to the flow rate ratio control system 100. The gas panel GP, the flow rate ratio control system 100, and the film forming chamber C constitute a film forming system 200, which forms a film on a base material.

Specifically, as illustrated in FIG. 1, the flow rate ratio control system 100 includes a plurality of split channels 1 provided parallel to each other, flow rate sensors 2 and fluid control valves 3, which are provided in the respective split channels 1, and a control device 4, which controls the fluid control valves 3 on the basis of the output values of the flow rate sensors 2. Note that each flow rate sensor 2 and each fluid control valve 3 constitute a thermal mass flow controllers MFC here.

The split channels 1 are provided corresponding to, for example, the plurality of supply ports provided in the above-mentioned film forming chamber C, and here the split channels 1 branch from a common main channel X. In other words, an introduction port of each of the split channels 1 is connected to the main channel X. Note that the main channel X here is provided with a fluid control device such as a mass flow controller (not illustrated), and a fluid with a fixed flow rate (such as 1000 standard cubic centimeters per minute (SCCM)) is set to flow.

Figure 2:
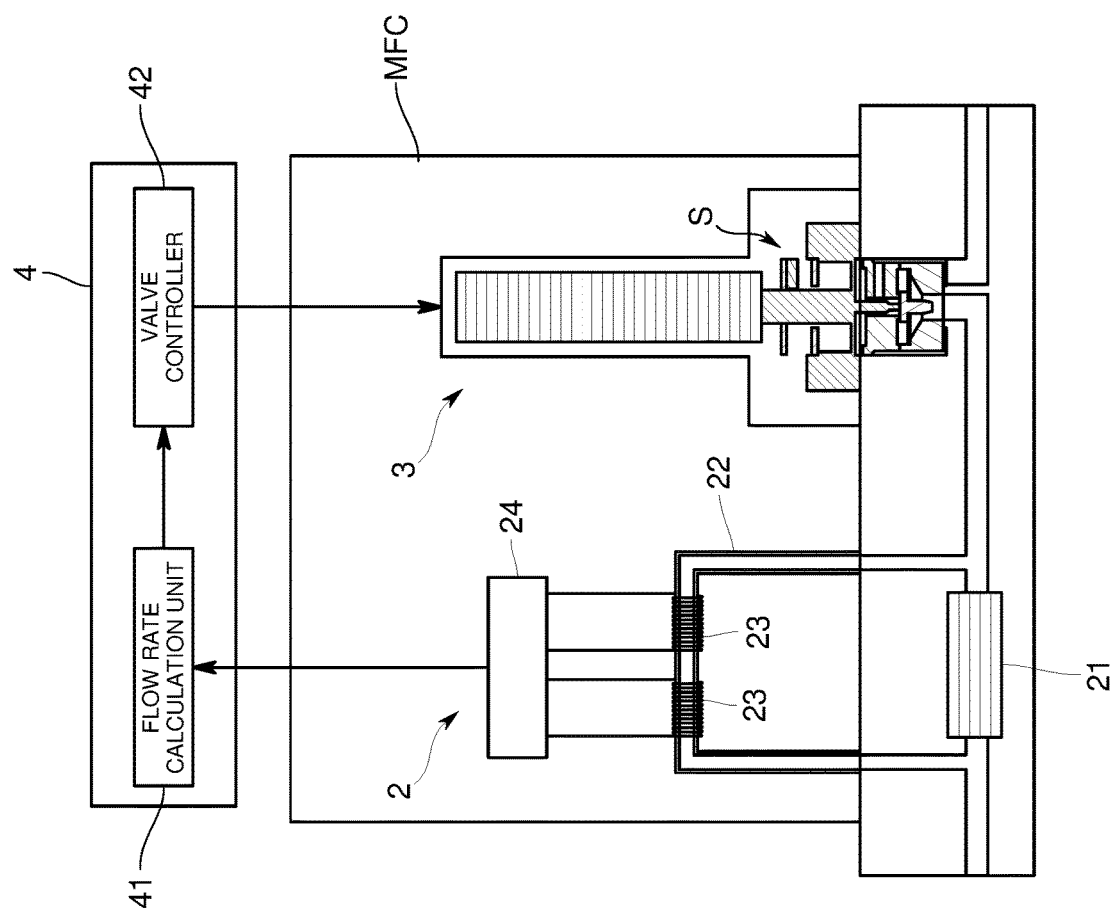
FIG. 2 is a schematic diagram illustrating the configuration of a flow rate sensor and a fluid control valve in the embodiment.

The flow rate sensors 2 are provided in the respective split channels 1. Specifically, these flow rate sensors 2 are thermal sensors. As illustrated in FIG. 2, each of the flow rate sensors 2 includes the following: a laminar flow element 21 provided in the split channel 1; a thin tube 22 branching upstream of the laminar flow element 21 and joining downstream of the laminar flow element 21; a pair of electric heating coils 23 wound around the thin tube 22, to which voltage is applied so that they are kept at a constant temperature; a detection circuit 24, which detects a voltage difference applied to each of the electric heating coils 23; and a flow rate calculation unit 41, which calculates the flow rate of a gas flowing in the channel on the basis of the output of the detection circuit 24. Although the laminar flow element 21 here is a bypass such as one formed by inserting a plurality of thin tubes 22 into the interior of an external tube or one formed by laminating a plurality of thin discs provided with a plurality of through-holes, a resistor such as a restrictor or a sonic nozzle may be used as the laminar flow element 21. In addition, the electric heating coils 23 need not be kept at a constant temperature, such as in the case where each flow rate sensor 2 employs changes in temperature of the electric heating coils 23.

The fluid control valves 3 are provided downstream of the flow rate sensors 2 in the respective split channels 1. Specifically, these fluid control valves 3 are, for example, piezo valves, as illustrated in FIG. 2, and their opening degrees are controlled by applied voltage. More specifically, a film forming device is provided downstream of these fluid control valves 3, and the opening degrees of these fluid control valves 3 are controlled so that appropriate flow rates will be supplied to a plurality of gas supply areas of the film forming device. In the present embodiment, in order to reduce the effect of hysteresis of the opening degree of each fluid control valve 3 on the applied voltage and to realize high-speed and highly-accurate flow velocity control or flow rate control, each fluid control valve 3 is a valve with a position sensor S, which detects the position of the valve body with respect to the valve seat. However, a valve having no position sensor S may be used as each fluid control valve 3.

The control device 4 is physically a general-purpose or dedicated computer including a central processing unit (CPU), memory, an analog-to-digital (A/D) converter, a digital-to-analog (D/A) converter, an input-output interface, and the like. By executing a control program stored in the memory and the CPU collaborating with various devices, as illustrated in FIG. 2, the control device 4 functions at least as the above-mentioned flow rate calculation unit 41 and a valve controller 42, which controls the opening degree of each of the fluid control valves 3 so that the calculated flow rate, which is calculated by the flow rate calculation unit 41, becomes closer to a preset flow rate. Note that the functions as the flow rate calculation unit 41 and the valve controller 42 may be included in the mass flow controller MFC mentioned above.

Figure 3:
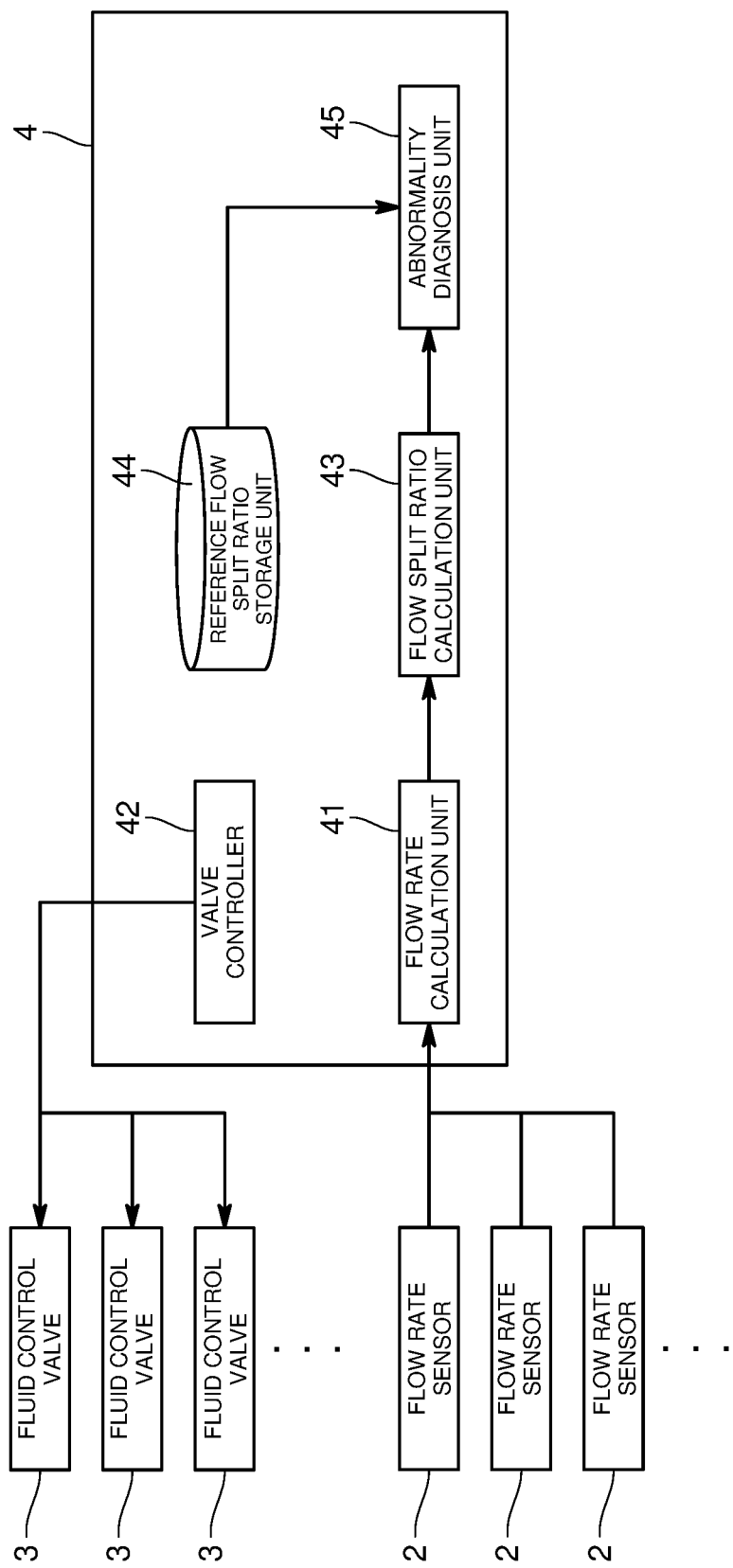
FIG. 3 is a functional block diagram illustrating the functions of a control device in the embodiment.

And, the flow rate ratio control system 100 of the present embodiment further includes the following functions, as illustrated in FIG. 3: a flow split ratio calculation unit 43, which calculates the actual flow split ratio, which is the ratio of fluids flowing in the split channels 1; a reference flow split ratio storage unit 44, which stores a reference flow split ratio serving as a reference for the actual flow split ratio; and an abnormality diagnosis unit 45, which compares the actual flow split ratio and the reference flow split ratio, and diagnoses a system abnormality.

Note that the actual flow split ratio here is the ratio of fluids flowing in the split channels 1 when an abnormality of the flow rate ratio control system 100 is diagnosed, and specifically is the ratio of the output values of the flow rate sensors, which are obtained by allowing, while the fluid control valves of different split channels are closed, fluids to flow in these split channels.

More specifically, as illustrated in FIG. 3, here, an abnormality diagnosis program is stored in the memory of the above-mentioned control device 4. By executing this abnormality diagnosis program and the CPU collaborating with various devices, the control device 4 functions as the flow split ratio calculation unit 43, the reference flow split ratio storage unit 44, and the abnormality diagnosis unit 45, which are described above. Note that all or some of these functions may be configured to be implemented by a different computer other than the control device 4. In addition, the control device 4 includes a target flow rate ratio receiving unit (not illustrated) that receives a target value of the ratio of flow rates flowing in the split channels 1 upon processing, and, for example, the target flow rate ratio is configured to be set or changed from the outside by a user using an input unit.

Figure 4:
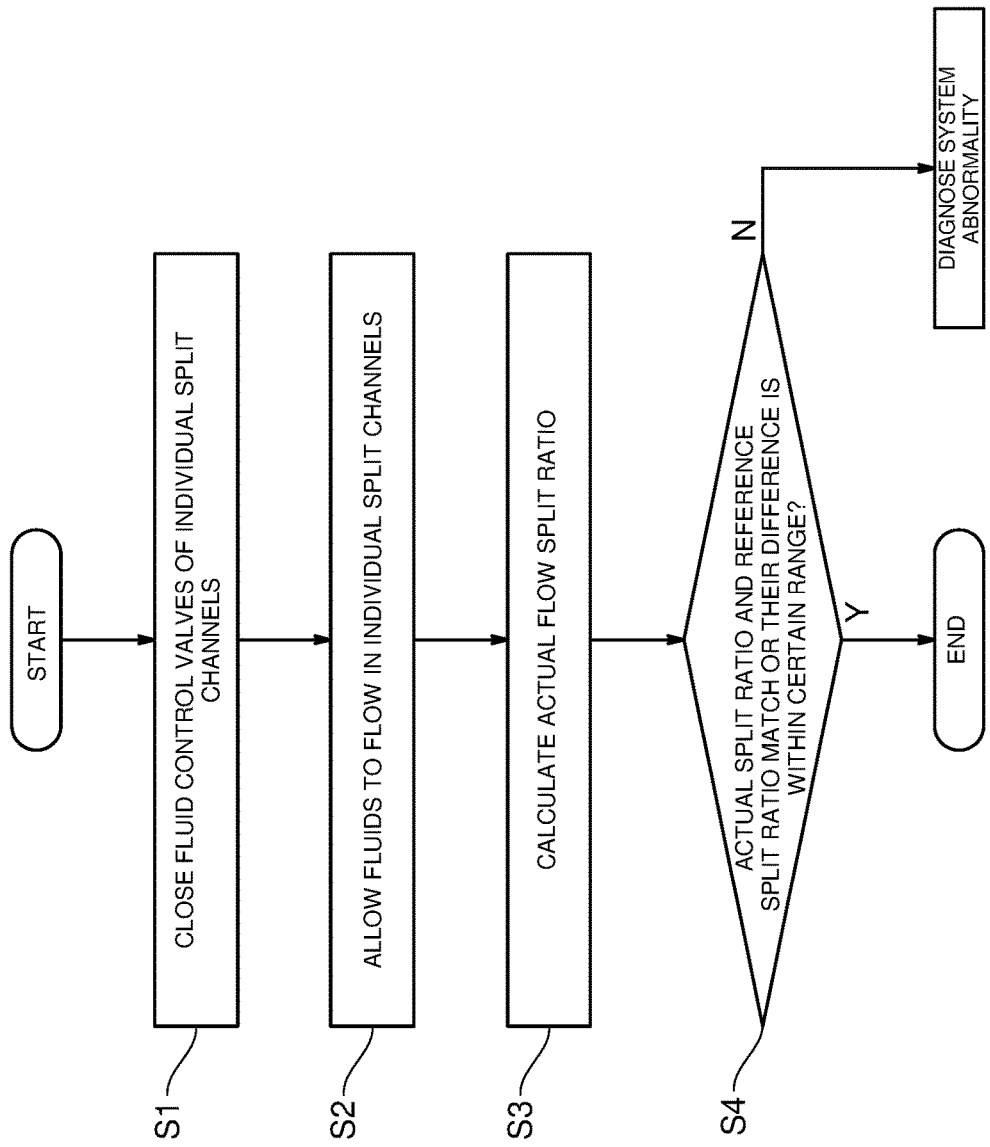
FIG. 4 is a flowchart illustrating an operation method of abnormality diagnosis in the embodiment.

Hereinafter, an abnormality diagnosis method of diagnosing an abnormality of the flow rate ratio control system 100 will be described with reference to the flowchart illustrated in FIG. 4, which also serves as a description of the function of each unit.

At first, when abnormality diagnosis is started, the above-mentioned valve controller 42 closes the fluid control valves 3 provided in the individual split channels 1 (S1).

Next, while the fluid control valves 3 are closed, fluids are allowed to flow in the respective split channels 1 (S2). At this time, a fluid with a certain flow rate flows in the main channel X, and that fluid is split into the plural split channels 1. The split fluids flow into internal volumes Z extending from the flow rate sensors 2 to the fluid control valves 3 in the respective split channels 1, and the flow rate sensors 2 output values indicating the flow rates of their split channels 1 at that time.

Then, the flow split ratio calculation unit 43 obtains the output values from the flow rate sensors 2 and calculates the ratio of the output values from the individual flow rate sensors 2 as the actual flow split ratio (S3). In other words, this actual flow split ratio is obtained by allowing fluids to flow in the internal volumes Z extending from the flow rate sensors 2 to the fluid control valves 3 in the split channels 1.

Here, the reference flow split ratio stored in the reference flow split ratio storage unit 44 will be described. The reference flow split ratio here is a reference as to whether a system abnormality is occurring, and is obtained when the system is normal, such as at an early stage of manufacturing the system or after the maintenance of the system.

Specifically, the reference flow split ratio is the ratio of the output values of the flow rate sensors 2 obtained by allowing, while the fluid control valves 3 in different split channels 1 are closed when the system is normal, such as at an early stage of manufacturing the system or after the maintenance of the system, fluids to flow in these split channels 1.

In such a configuration, when the actual flow split ratio is calculated by the flow split ratio calculation unit 43 as described above, the abnormality diagnosis unit 45 compares the actual flow split ratio and the reference flow split ratio, and diagnoses a system abnormality (S4). Specifically, in the case where the actual flow split ratio matches the reference flow split ratio or a difference between the two ratios is within a certain range, the abnormality diagnosis unit 45 determines that no system abnormality is occurring; and, in the case where the actual flow split ratio does not match the reference flow split ratio or a difference between the two ratios is outside the certain range, the abnormality diagnosis unit 45 determines that a system abnormality is occurring.

Figure 5:
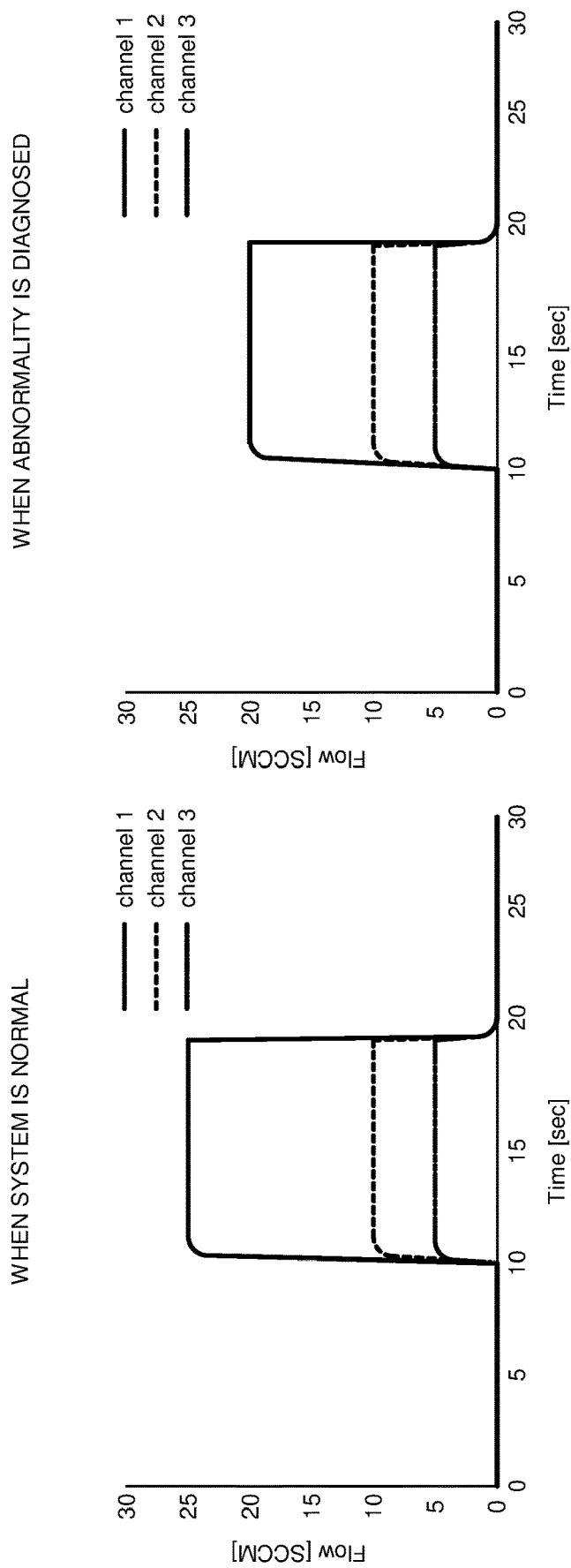
FIG. 5 includes graphs illustrating changes in flow rate upon a system abnormality in the embodiment.

The contents of a diagnosis will be described in more specific details. For example, as illustrated in FIG. 5, in the case where the actual flow split ratio includes a numeral smaller than the reference flow split ratio (see channel 1 in FIG. 5), the abnormality diagnosis unit 45 determines that there is an abnormality in the flow rate sensor 2 of a split channel 1 corresponding to that numeral. An example of the abnormality of the flow rate sensor 2 in this case includes clogging of the laminar flow element 21. Although the flow rates flowing in the split channels 1 (the individual channels) are different when the system is normal in the mode illustrated in FIG. 5, this is due to an instrumental error in the internal volume Z of each split channel 1 or an instrumental error in a bypass channel of each flow rate sensor 2, and the flow rates flowing in the split channels 1 may sometimes be equal when the system is normal.

Figure 6:
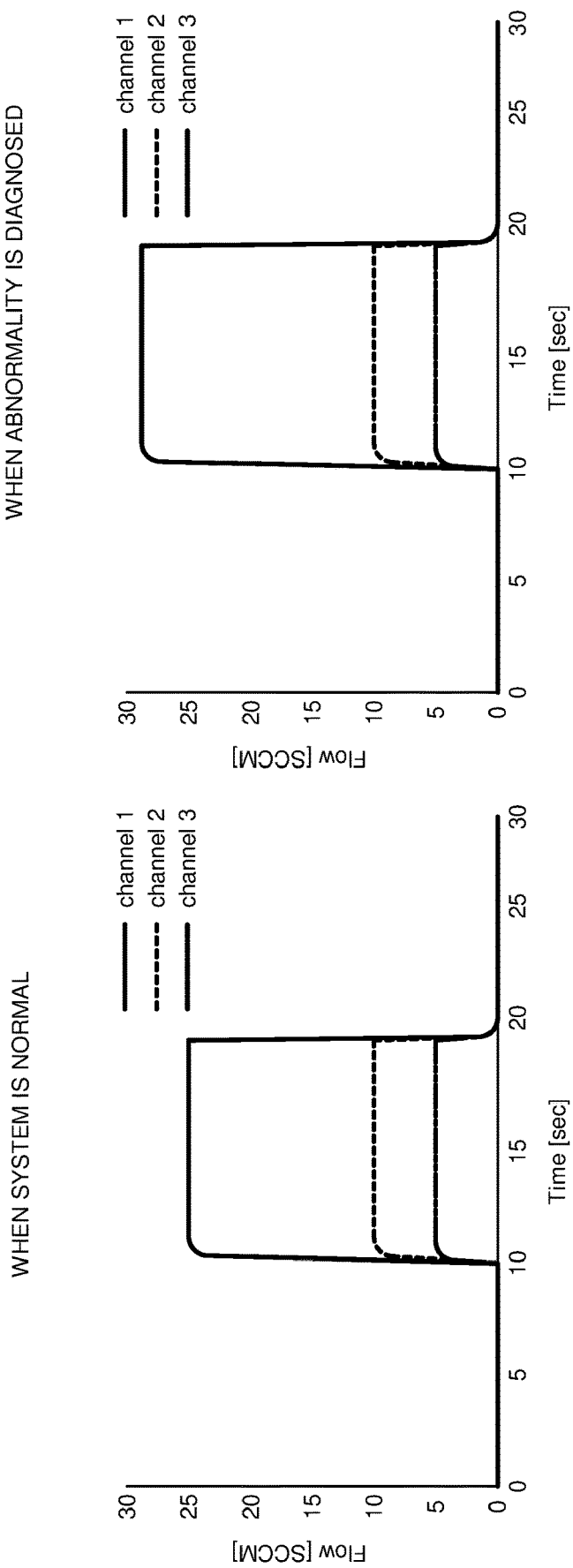
FIG. 6 includes graphs illustrating changes in flow rate upon a system abnormality in the embodiment.

In contrast, as illustrated in FIG. 6, in the case where the actual flow split ratio includes a numeral larger than the reference flow split ratio (see channel 1 in FIG. 6), the abnormality diagnosis unit 45 determines that there is an abnormality in the fluid control valve 3 of a split channel 1 corresponding to that numeral. An example of the abnormality of the fluid control valve 3 in this case includes a leakage. Although the flow rates flowing in the split channels 1 (the individual channels) are different when the system is normal in the mode illustrated in FIG. 6, the flow rates flowing in the split channels 1 may sometimes be equal when the system is normal, as described above.

According to the flow rate ratio control system 100 of the present embodiment, which is configured as above, because the actual flow split ratio and the reference flow split ratio are compared, it may be possible to diagnose whether a system abnormality that affects the actual flow split ratio is occurring, such as various abnormalities including a leakage in a fluid control valve 3, or various abnormalities including clogging in a flow rate sensor 2.

In addition, the actual flow split ratio is calculated by allowing fluids to flow in the internal volumes Z of the split channels 1, and the internal volumes Z are constant for the respective split channels 1. Therefore, the actual flow split ratio obtained in this manner becomes a constant ratio with good reproducibility if there is no system abnormality, and accordingly, the plausibility of the diagnosis may be enhanced.

Note that the present invention is not limited to the above-described embodiment.

Figure 7:
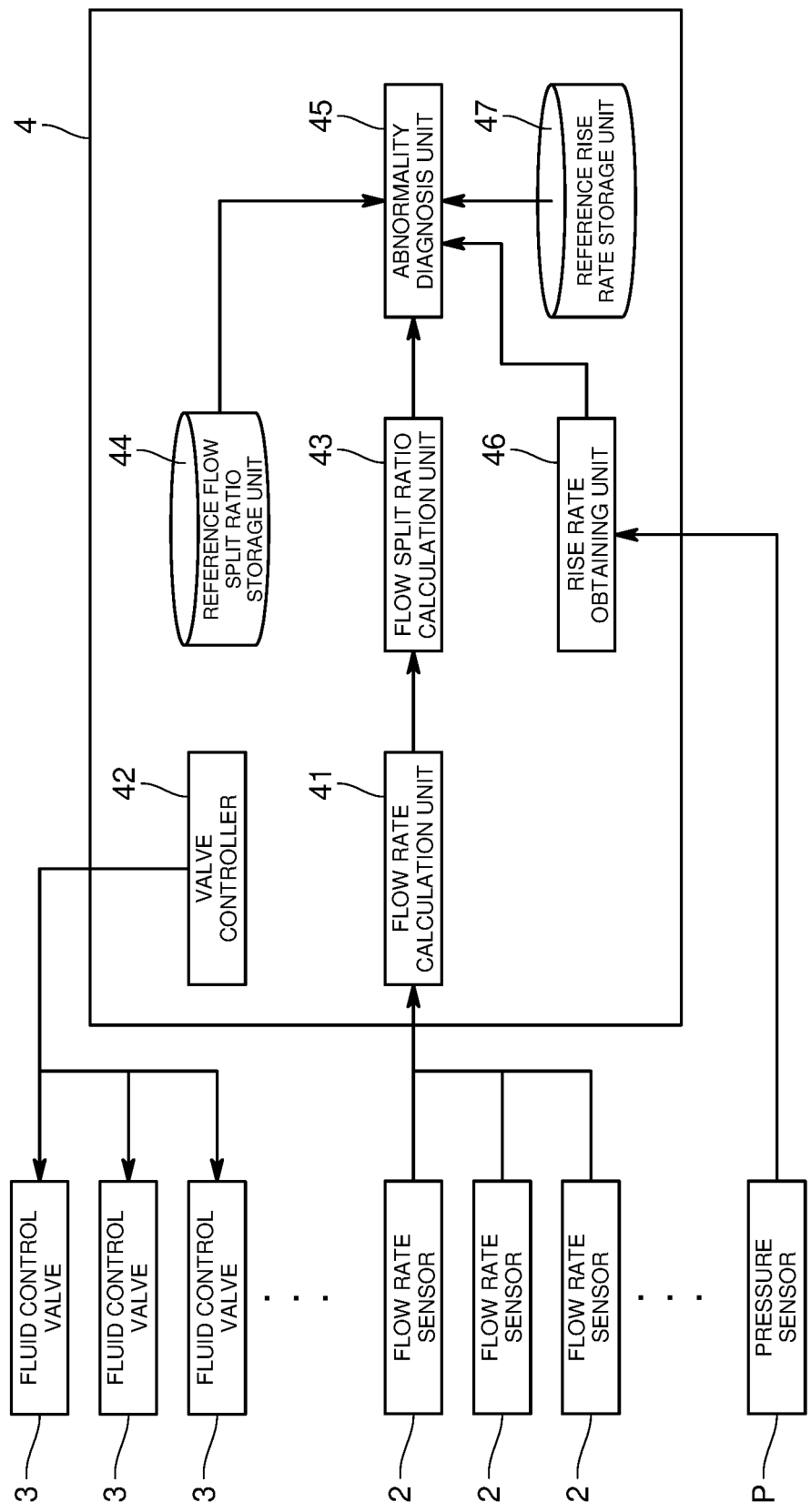
FIG. 7 is a functional block diagram illustrating the functions of a control device in another embodiment.

For example, as illustrated in FIG. 7, the flow rate ratio control system 100 may further include a pressure sensor P for detecting the pressure of the introduction port of each split channel 1, and a rise rate obtaining unit 46 for obtaining the rise rate (tilt) of the output value of the pressure sensor P obtained by allowing, while the fluid control valves 3 of different split channels 1 are closed, fluids to flow in these split channels 1.

In such a configuration, the abnormality diagnosis unit 45 may diagnose a system abnormality by comparing the actual rise rate obtained by the rise rate obtaining unit 46 and a certain reference rise rate stored in advance in a reference rise rate storage unit 47.

As a more specific mode of the abnormality diagnosis unit 45, in the case where the actual rise rate is higher than the reference rise rate, the abnormality diagnosis unit 45 diagnoses that there is clogging in a flow rate sensor 2; and, in the case where the actual rise rate is lower than the reference rise rate, the abnormality diagnosis unit 45 diagnoses that there is a leakage in a fluid control valve 3.

Furthermore, in the case where there is a difference between the actual rise rate and the reference rise rate, the valve controller 42 may control the opening degree of at least one fluid control valve 3 so that the actual rise rate will match the reference rise rate.

With such a configuration, the actual rise rate may match the reference rise rate without adding a new control system. Accordingly, by allowing the pressure of the introduction port of a split channel 1 to rise along the reference rise rate upon the diagnosis of a system abnormality, conditions for pressure rise upon multiple diagnoses may be made uniform.

In addition, the flow rate ratio control system 100 may have a function as a recovery unit (not illustrated) that, in the case where the abnormality diagnosis unit 45 diagnoses that there is a system abnormality, automatically resolves the system abnormality.

Specific modes of the recovery unit include, for example, in the case where it is diagnosed that there is clogging in a flow rate sensor 2, a mode of changing a conversion factor used for calculating the flow rate by the flow rate calculation unit 41, or a mode of changing the set flow rate used for controlling a corresponding fluid control valve 3 by the valve controller 42.

Although it is described in the above-described embodiment that the flow rate sensors 2 are thermal sensors, the flow rate sensors 2 may be pressure sensors.

Besides the above, various modifications of the embodiment may be made or some portions of the embodiment may be combined as long as they do not contradict the gist of the present invention.

What is claimed is:

1. A flow rate ratio control system including a plurality of split channels provided parallel to each other, a flow rate sensor provided in each of the split channels, and a fluid control valve provided downstream of the flow rate sensor in each of the split channels, the fluid control valves being controlled so that a ratio of flow rates of fluids flowing in the respective split channels becomes a certain flow split ratio, the system comprising:
    a flow split ratio calculation unit that calculates a ratio of output values of the flow rate sensors obtained by allowing, while the fluid control valves of different split channels are closed, fluids to flow in these split channels as an actual flow split ratio;
    a reference flow split ratio storage unit that stores a reference flow split ratio serving as a reference for the actual flow split ratio; and
    an abnormality diagnosis unit that compares the actual flow split ratio and the reference flow split ratio, and diagnoses a system abnormality.

2. The flow rate ratio control system according to claim 1, wherein the actual flow split ratio calculated by the flow split ratio calculation unit is obtained by allowing fluids to flow in internal volumes extending from the flow rate sensors to the fluid control valves in the split channels.

3. The flow rate ratio control system according to claim 1, wherein the reference flow split ratio is a ratio of output values of the flow rate sensors obtained by allowing, while the fluid control valves of different split channels are closed at an early stage of manufacturing the system or after maintenance of the system, fluids to flow in these split channels.

4. The flow rate ratio control system according to claim 1, wherein, in a case where the actual flow split ratio includes a numeral smaller than the reference flow split ratio, the abnormality diagnosis unit diagnoses that there is an abnormality in the flow rate sensor of a split channel corresponding to the numeral.

5. The flow rate ratio control system according to claim 1, wherein, in a case where the actual flow split ratio includes a numeral larger than the reference flow split ratio, the abnormality diagnosis unit diagnoses that there is an abnormality in the fluid control valve of a split channel corresponding to the numeral.

6. The flow rate ratio control system according to claim 1, wherein the flow rate sensors are thermal flow rate sensors.

7. The flow rate ratio control system according to claim 1, wherein the fluid control valves are each a valve with a position sensor that detects a position of a valve body with respect to a valve seat.

8. A film forming system comprising:
    the flow rate ratio control system according to claim 1;
    a gas panel that is provided upstream of the flow rate ratio control system and that supplies a fluid to the flow rate ratio control system; and
    a film forming chamber that is provided downstream of the flow rate ratio control system, and fluids whose flow split ratio is controlled by the flow rate ratio control system are supplied to the film forming chamber.

9. An abnormality diagnosis method for a flow rate ratio control system including a plurality of split channels provided parallel to each other, a flow rate sensor provided in each of the split channels, and a fluid control valve provided downstream of the flow rate sensor in each of the split channels, the fluid control valves being controlled so that a ratio of flow rates of fluids flowing in the respective split channels becomes a certain flow split ratio, the method comprising:
    calculating a ratio of output values of the flow rate sensors obtained by allowing, while the fluid control valves of different split channels are closed, fluids to flow in these split channels as an actual flow split ratio; and
    comparing the actual flow split ratio and a reference flow split ratio serving as a reference for the actual flow split ratio, and diagnosing a system abnormality.

10. An abnormality diagnosis program medium used in a flow rate ratio control system including a plurality of split channels provided parallel to each other, a flow rate sensor provided in each of the split channels, and a fluid control valve provided downstream of the flow rate sensor in each of the split channels, the fluid control valves being controlled so that a ratio of flow rates of fluids flowing in the respective split channels becomes a certain flow split ratio, the medium storing a program causing a computer to function as:
- a flow split ratio calculation unit that calculates a ratio of output values of the flow rate sensors obtained by allowing, while the fluid control valves of different split channels are closed, fluids to flow in these split channels as an actual flow split ratio;
- a reference flow split ratio storage unit that stores a reference flow split ratio serving as a reference for the actual flow split ratio; and
- an abnormality diagnosis unit that compares the actual flow split ratio and the reference flow split ratio, and diagnoses a system abnormality.

* * * * *